United States Patent
Range et al.

(10) Patent No.: US 10,912,211 B2
(45) Date of Patent: Feb. 2, 2021

(54) FLEXURE FOR ACCOMMODATING MISALIGNMENTS IN AN ASSEMBLY

(71) Applicant: Raytheon Company, Waltham, MA (US)

(72) Inventors: Jake B. Range, McKinney, TX (US); Andrew Short, Allen, TX (US); Gabriel A. Payan, McKinney, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/124,019

(22) Filed: Sep. 6, 2018

(65) Prior Publication Data
US 2020/0084901 A1    Mar. 12, 2020

(51) Int. Cl.
| | |
|---|---|
| *H05K 5/02* | (2006.01) |
| *H05K 5/03* | (2006.01) |
| *H05K 7/20* | (2006.01) |
| *F16F 15/04* | (2006.01) |
| *F16F 15/22* | (2006.01) |

(52) U.S. Cl.
CPC ........... *H05K 5/0217* (2013.01); *F16F 15/04* (2013.01); *H05K 5/03* (2013.01); *H05K 7/20436* (2013.01); *F16F 2230/0005* (2013.01)

(58) Field of Classification Search
CPC ......... H05K 5/0217; H05K 5/03; F16F 15/04; F16F 2230/0005
USPC ....................... 361/679.46–679.54, 688–733; 165/80.1–80.3; 257/718–719; 24/453, 24/458–459
See application file for complete search history.

(56) References Cited

U.S. PATENT DOCUMENTS

| | | | | |
|---|---|---|---|---|
| 2,317,315 | A | * | 4/1943 | Wallace ................ B25B 31/005 24/453 |
| 3,000,086 | A | * | 9/1961 | Davis ........................ F16B 5/06 24/453 |
| 3,474,541 | A | * | 10/1969 | Cubberly, Jr. .......... E21B 47/08 33/544.3 |
| 3,531,069 | A | * | 9/1970 | Dubberley ............ F04B 39/127 248/565 |
| 4,677,979 | A | * | 7/1987 | Burns ................ A61B 5/15142 606/172 |
| 5,211,197 | A | * | 5/1993 | Marrison ................ F16L 37/23 137/614 |

(Continued)

FOREIGN PATENT DOCUMENTS

| | | |
|---|---|---|
| CN | 105882993 A | 8/2016 |
| DE | 4336834 C1 | 6/1995 |
| JP | 2001-024114 A | 1/2001 |

OTHER PUBLICATIONS

International Search Report for International Application No. PCT/US2019/040736 dated Oct. 22, 2019, 16 pages.

*Primary Examiner* — Zachary Pape
*Assistant Examiner* — Amir A Jalali (57) ABSTRACT

A flexure is disclosed for accommodating misalignments in an assembly. The flexure can include a first portion, a second portion, and a flexible portion coupling the first portion and the second portion to one another. The flexible portion can facilitate relative movement between the first and second portions in a plurality of degrees of freedom. The flexure can further include one or more stops operable to limit relative movement between the first and second portions in at least two of the plurality of degrees of freedom.

28 Claims, 9 Drawing Sheets

(56) References Cited

U.S. PATENT DOCUMENTS

| | | | |
|---|---|---|---|
| 5,595,371 A | | 1/1997 | Hukuda et al. |
| 6,418,628 B1 | * | 7/2002 | Steingass ............... A62B 3/005 |
| | | | 30/366 |
| 7,995,310 B1 | | 8/2011 | Pan |
| 8,118,825 B2 | * | 2/2012 | Schraga ........... A61B 5/150022 |
| | | | 606/182 |
| 9,756,229 B2 | | 9/2017 | Seger et al. |
| 9,774,117 B1 | | 9/2017 | Jackson et al. |
| 9,946,315 B2 | * | 4/2018 | Degner ..................... G06F 1/20 |
| 2004/0140821 A1 | * | 7/2004 | Lee .................... G01R 1/07314 |
| | | | 324/754.14 |
| 2006/0279301 A1 | * | 12/2006 | Treibergs ........... G01R 1/06722 |
| | | | 324/754.05 |
| 2007/0129653 A1 | * | 6/2007 | Sugar ....................... A61H 1/02 |
| | | | 601/5 |
| 2007/0162065 A1 | * | 7/2007 | Li .................... A61B 5/150022 |
| | | | 606/182 |
| 2008/0167673 A1 | * | 7/2008 | Zhong .............. A61B 5/150183 |
| | | | 606/181 |
| 2008/0192384 A1 | | 8/2008 | Danielson et al. |
| 2012/0161350 A1 | | 6/2012 | Swanson et al. |
| 2015/0144321 A1 | * | 5/2015 | Kim .................... H01L 23/4006 |
| | | | 165/185 |
| 2017/0131621 A1 | | 5/2017 | Tang et al. |
| 2017/0214830 A1 | | 7/2017 | Tang et al. |
| 2017/0313417 A1 | | 11/2017 | Chen et al. |

* cited by examiner

FIG. 9 ered by the patent.

FLEXURE FOR ACCOMMODATING MISALIGNMENTS IN AN ASSEMBLY

BACKGROUND

Electronic systems come in many shapes and sizes and often include a frame or other mounting structure in support of an electronic device as well as a housing or cover for the electronic device coupled to the frame, which can be removed for maintenance or replacing damaged components. Housings or covers often occupy large amounts of prime, desirable thermal "real estate" that may be utilized to dissipate heat generated by electronic components within electronic systems, such as by integrating or mounting a heat sink onto a housing or cover. Interfacing a cover-mounted heat sink with a frame-mounted electronic component typically requires a precision alignment of interfacing surfaces to facilitate effective heat transfer to the cover. Due to the large tolerance stack-up that typically exists between covers and internal components, however, achieving the precision alignments necessary to, in effect, mount the electronic component to the cover, as well as to the frame, is often problematic. For example, attempting to maintain tight tolerances in order to minimize the effects of tolerance stack-up may significantly increase manufacturing costs. As an alternative to this approach, some designs utilize rattle brackets to couple an electronic device to the frame prior to attaching the cover to the electronic device and the frame. Such a bracket provides a loose connection with the frame (hence the term "rattle") that allows the electronic device to move relative to the frame so that a precise alignment can be achieved when interfacing and coupling the electronic device with the cover. In other designs, an electronic component is "hard mounted" directly on the cover prior to coupling the cover to the frame. The electronic component is electrically connected to frame-mounted electronic components via electrical "hard" wiring or a blind mate electrical connector between the cover and the frame. In many applications, covers may be frequently removed and reinstalled to perform service, upgrades, replace damaged parts, etc., which complicates matters and can lead to damaged electrical connections, misaligned interfaces, or other detrimental results.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of the inventive concepts are provided below and then specific examples are described in further detail later. This initial summary is intended to aid readers in understanding the examples more quickly, but is not intended to identify key features or essential features of the examples, nor is it intended to limit the scope of the claimed subject matter.

Although utilizing rattle brackets or mounting electronic components directly to the cover can enable correct alignment of precision interfaces, these approaches are not without their drawbacks. Rattle brackets result in undesirable electronics motion/rattle before final assembly with the cover and create wiring pinch point risks that can damage wiring upon assembly. Electronic components installed directly on the cover that utilize connecting "hard" wiring attached to internal frame-mounted electronics poses a risk of damaging the connecting wiring upon assembly/disassembly, particularly if a technician forgets to disconnect the connecting wiring when removing the cover. Utilizing blind mate electrical connectors instead of connecting wiring can obviate this risk, however connecting pins of blind mate connectors are easily damaged, even if guide brackets are included, due to the lack of visibility on connector alignment during cover install. In addition, as the number of pins increases for larger blind mate connectors, assembly forces greatly increase (due to pin spring force to maintain electrical continuity), which increases the likelihood of damage to the pins if misaligned.

Accordingly, a flexure is disclosed that can enable alignment of precision surfaces, such as interfacing heat transfer surfaces, which may be misaligned due to tolerance stack-up. The flexure can include a first portion, a second portion, and a flexible portion coupling the first portion and the second portion to one another. The flexible portion can facilitate relative movement between the first and second portions in a plurality of degrees of freedom. The flexure can further include one or more stops operable to limit relative movement between the first and second portions in at least two of the plurality of degrees of freedom. Such stops can provide protection to the flexible portion from damage due to excessive deflection.

In one aspect, a flexure can comprise a first portion, a second portion, and a flexible portion coupling the first portion and the second portion to one another. The flexible portion can facilitate relative movement between the first and second portions in one or more degrees of freedom. The flexure can further include at least one stop operable to limit relative movement between the first and second portions bi-directionally in at least one of the one or more degrees of freedom.

In one aspect, a flexure assembly is provided that can include a first mounting structure, a first coupling interface associated with the first mounting structure, a second coupling interface operable to interface with the first coupling interface, and a second mounting structure operable to be coupled to the first mounting structure in a fixed relationship. Additionally, the flexure assembly can include a flexure operable to facilitate positioning of the first and second coupling interfaces relative to one another in an interfacing relationship. The flexure can include a first portion associated with the second coupling interface, a second portion coupled to the second mounting structure, and a flexible portion coupling the first portion and the second portion to one another. The flexible portion can facilitate relative movement between the first and second portions in a plurality of degrees of freedom. The flexure can further include one or more stops operable to limit relative movement between the first and second portions in at least two of the plurality of degrees of freedom.

In another aspect, a flexure assembly is provided that can include a first mounting structure, a first coupling interface associated with the first mounting structure, a second coupling interface operable to interface with the first coupling interface, and a second mounting structure operable to be coupled to the first mounting structure in a fixed relationship. In addition, the flexure assembly can include a flexure operable to facilitate positioning of the first and second coupling interfaces relative to one another in an interfacing relationship. The flexure can include a first portion associated with the second coupling interface, a second portion coupled to the second mounting structure, and a flexible portion coupling the first portion and the second portion to one another. The flexible portion can facilitate relative movement between the first and second portions in a plurality of degrees of freedom. The flexure can further include at least one stop operable to limit relative movement between the first and second portions bidirectionally in at least one of the one or more degrees of freedom.

Figure 1:
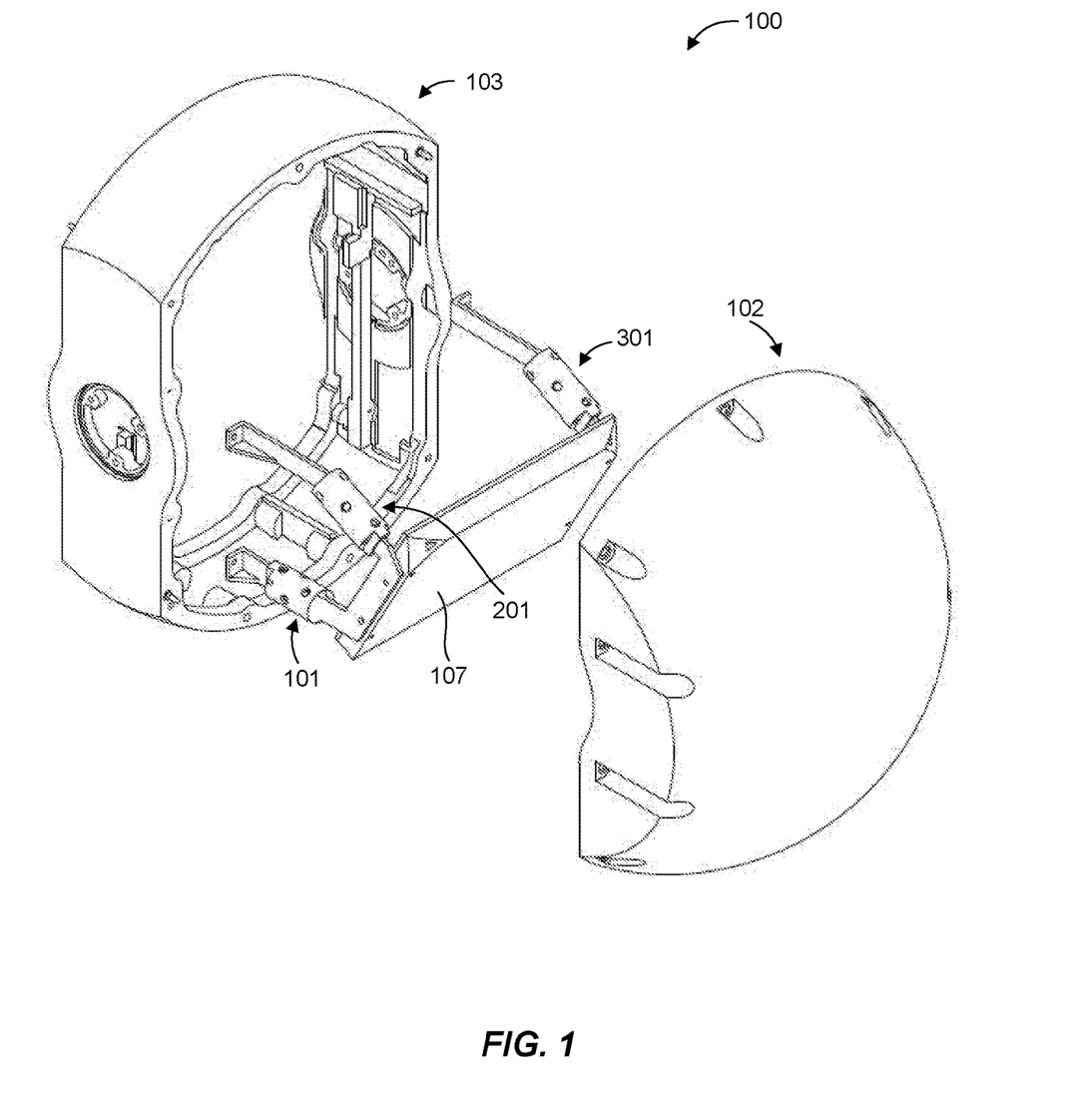
FIG. 1 is an illustration of a flexure assembly in accordance with an example of the present disclosure.

To further describe the present technology, examples are now provided with reference to the figures. With reference to FIG. 1, one embodiment of an assembly 100 is illustrated. In the illustrated embodiment, the assembly 100 is configured as a portion of a turret or gimballed sensor system that can house electrical sensors, such as optical sensors, as well as associated electronic components (a processor, computer memory, various other sensors, a power supply, etc.), at least some of which are collectively represented by an electronic device 107. A support frame of the turret, which can be operable to support the electronic device 107, can be referred to generally as a mounting structure 103, A cover or housing of the turret, which can be operable to cover and protect the electronic device 107, can be referred to generally as a mounting structure 102. The mounting structure 102 and the mounting structure 103 can be coupled to one another in a fixed relationship. In one embodiment, the mounting structure 102 can be, or include, a heat sink for the electronic device 107 to facilitate cooling the electronic device 107 utilizing the cover. Although the assembly 100 is shown in FIG. 1 as a turret, it will be recognized by those skilled in the art, and it is contemplated herein, that the assembly 100 can form or be part of any suitable type of device or system, such as at least a portion of an electrical or electromechanical system. As such, the example of a turret is not intended to be limiting in any way.

The assembly 100 can include one or more flexures 101, 201, 301 in accordance with the present technology, which can facilitate positioning coupling interfaces of the assembly 100 relative to one another in an interfacing relationship (e.g., for accommodating misalignments), such as between the electronic device 107 and a heat sink for the electronic device formed by or included with the mounting structure 102. Certain features of the assembly 100 are hidden from view in FIG. 1 (e.g., one or more coupling interfaces between the mounting structure 102 and the electronic device 107).

Figure 2A:
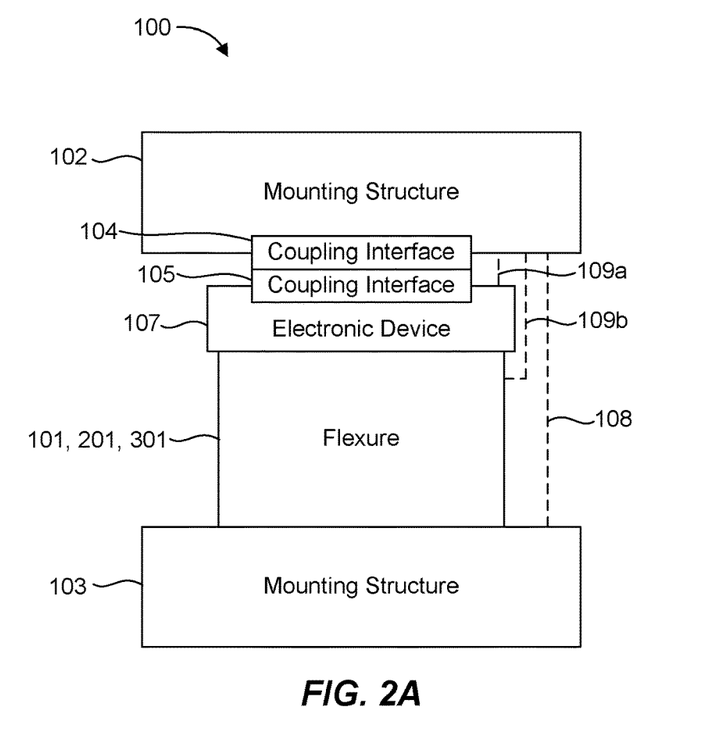
FIG. 2A is a schematic illustration of the flexure assembly of FIG. 1.

FIG. 2A schematically illustrates a coupling interface and flexure relationship of the assembly 100. For example, the electronic device 107 can be coupled to the flexures 101, 201, 301. The mounting structure 102 can be coupled (e.g., with fasteners) to the mounting structure 103 at a coupling 108. A coupling interface 104 can be associated with the mounting structure 102, which can be a heat sink surface. A coupling interface 105 can comprise at least a portion of and can be defined at least partially by the electronic device 107 (e.g., the coupling interface 105 can comprise a heat transfer surface of the electronic device 107). The coupling interfaces 104, 105 can be operable to interface with one another (e.g., a heat sink surface interfacing with a heat transfer surface of the electronic device 107), thereby facilitating heat transfer between them. The coupling interfaces 104, 105 may include precision surfaces, for example, which are tightly controlled for flatness to facilitate effective heat transfer when interfaced with one another, Due to misalignments and tolerance stack-up, the coupling interfaces 104, 105 may not properly align when the mounting structures 102, 103 are coupled to one another, which would prevent the coupling interfaces 104, 105 from having a good surface-to-surface contact and would degrade thermal performance. However, the flexures 101, 201, 301 can be operable to facilitate positioning of the coupling interfaces 104, 105 relative to one another in a proper interfacing relationship despite any misalignments that may exist, for example, by providing flexibility that allows the coupling interface 105 to "float" and be moved into proper position. The mounting structure 102 can be coupled (e.g., with fasteners) to the electronic device 107 at a coupling 109a and/or to the flexures 101, 201, 301 at a coupling 109b to maintain the coupling interfaces 104, 105 in proper position (e.g., in contact) relative to one another. Thus, one side of the flexures 101, 201, 301 can be mounted to a frame or bench, and the other side of the flexures 101, 201, 301 can be attached to a cover for interfacing a supported electronic component with a heat sink surface on the cover.

One benefit of the flexibility or "float" provided by the flexures 101, 201, 301 is that the electronic device 107 can be fully assembled with the mounting structure 103 (e.g., all mechanical and electrical connections in place) prior to installation of the mounting structure 102 (e.g., a cover). This can enable testing/troubleshooting of electronics and optics while these components are accessible with the cover off without losing the ability to mount and heatsink the electronic device 107 directly to the cover or allow undesirable electronics motion (e.g., as in a rattle bracket design). In addition, accommodating tolerance stack-up with the flexures 101, 201, 301 can avoid the high cost of maintaining tight tolerances on other components in the assembly in order to ensure proper fitment of the coupling interfaces 104, 105.

Figure 2B:
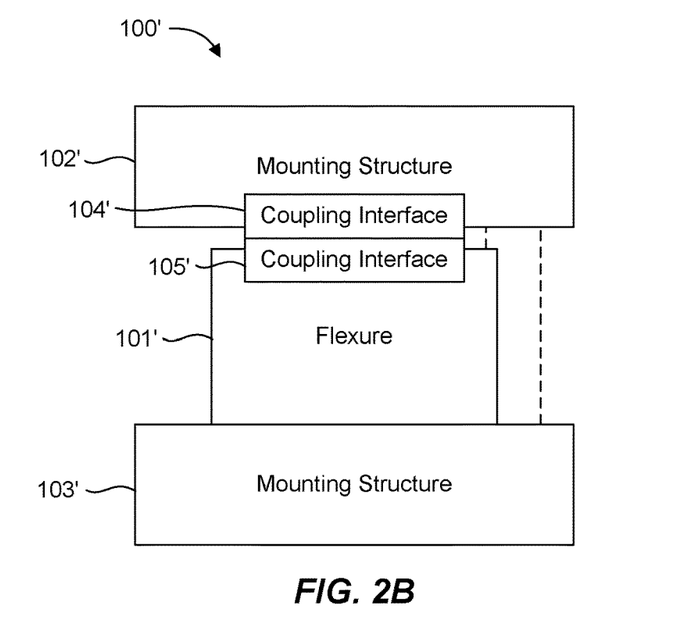
FIG. 2B is a schematic illustration of a flexure assembly in accordance with another example of the present disclosure.

FIG. 2B schematically illustrates an example of an assembly 100' with an alternative coupling interface and flexure relationship. As in the example illustrated in FIG. 2A, the assembly 100' shown in FIG. 2B can include mounting structures 102', 103', a coupling interface 104' associated with the mounting structure 102', a coupling interface 105' operable to interface with the coupling interface 104', and a flexure 101' operable to facilitate positioning of the coupling interfaces 104', 105' relative to one another in an interfacing relationship. As in other examples, the mounting structure 102' can comprise a heat sink (and optionally a housing to cover an electronic device) and the coupling interface 104' can be a heat sink surface. In the FIG. 2A example, the coupling interface 105' can be defined at least partially by the flexure 101'. Thus, the mounting structure 103' can comprise or be thermally coupled to a heat source (e.g., an electronic device or component) and the flexure 101' can form a thermal conduction path between the heat source (e.g., at 103') and the heat sink (at 102'). This can enable thermal conduction between internal components and the cover for components that cannot be mounted to the cover (e.g., for structural and/or sensor performance reasons).

Figure 3:
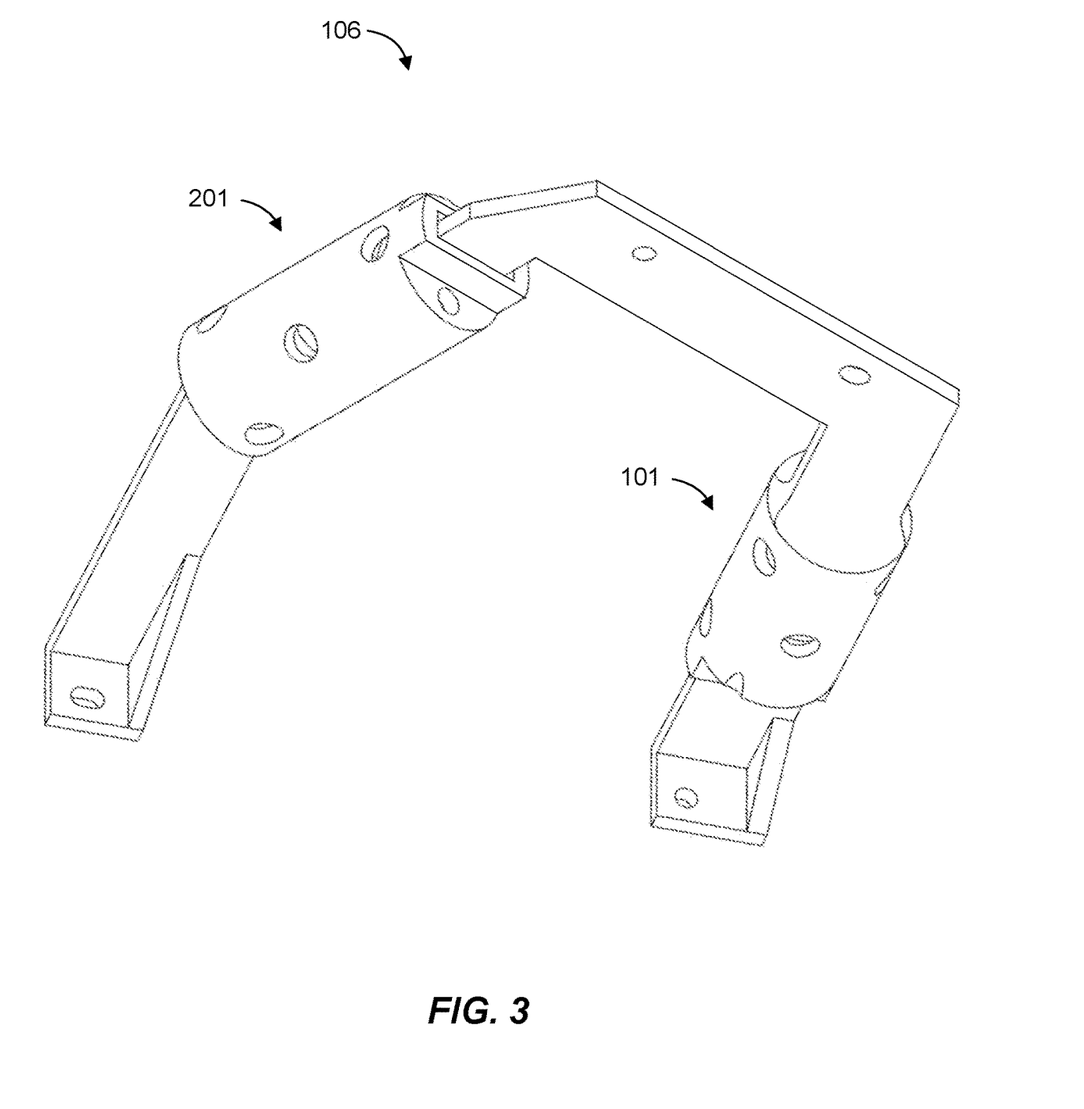
FIG. 3 shows flexures of the flexure assembly of FIG. 1 isolated from other components.
Figure 4:
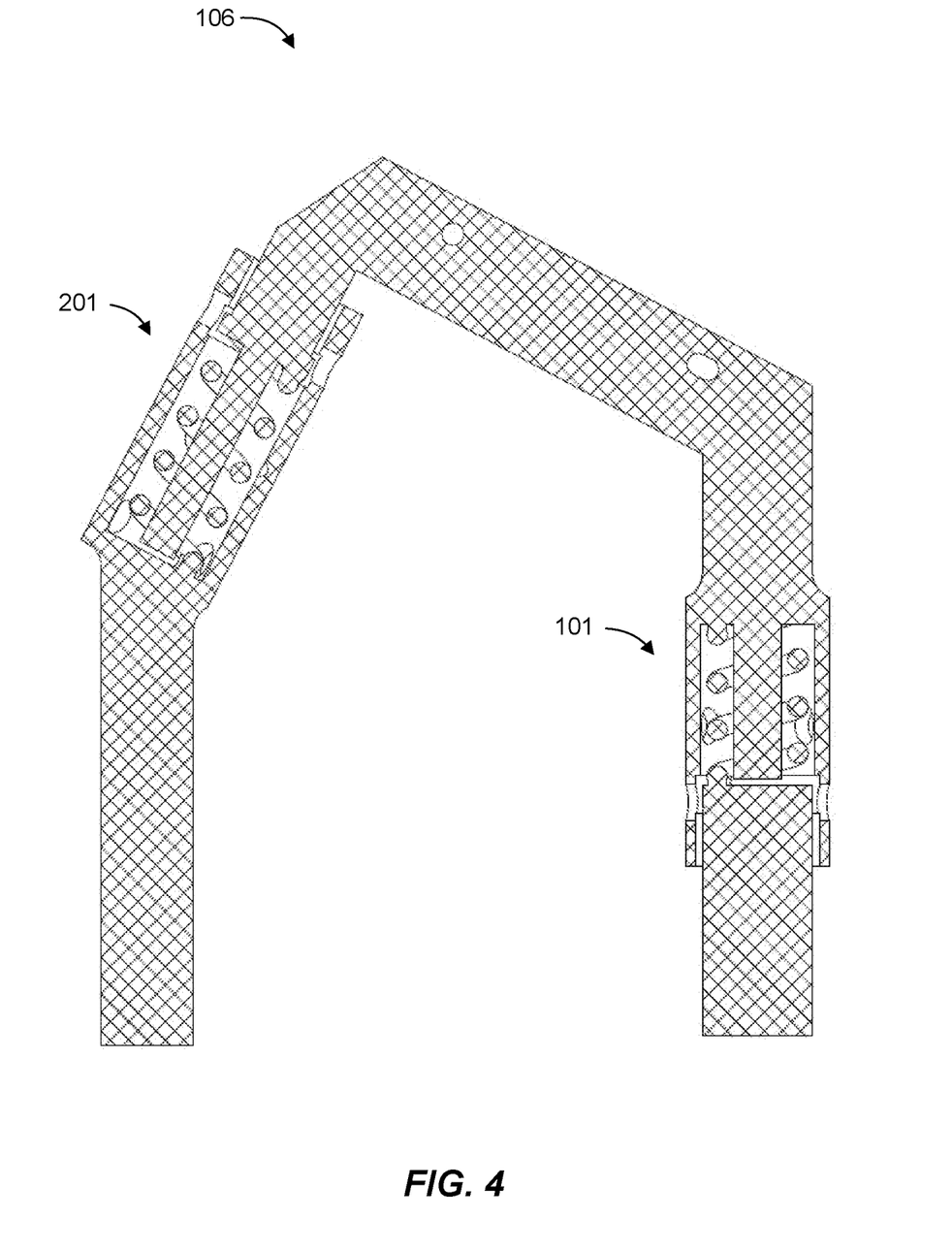
FIG. 4 is a cross-sectional view of the flexures of FIG. 3.
Figure 5:
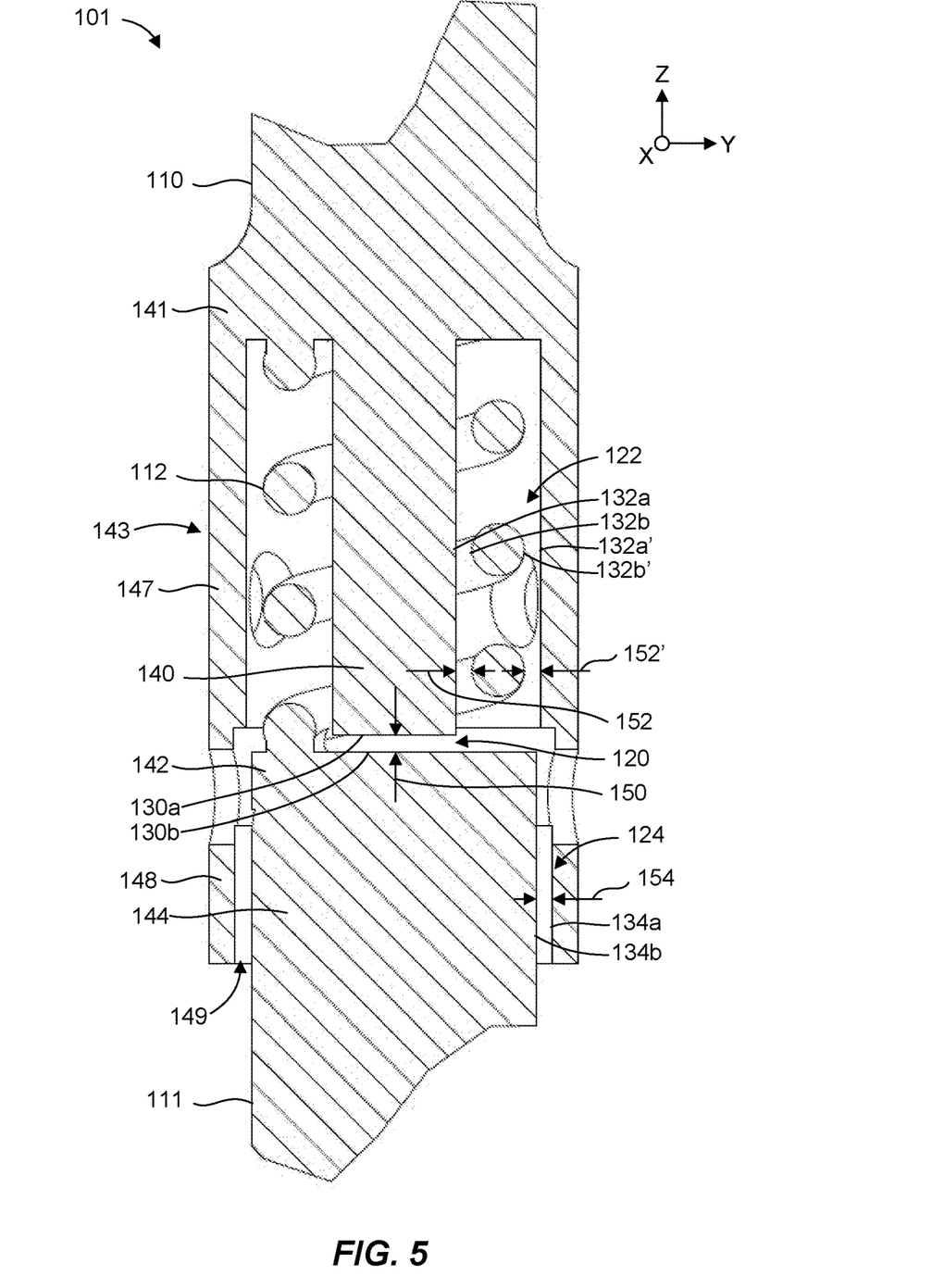
FIG. 5 is a detailed cross-sectional view of a flexure of FIG. 4 in accordance with an example of the present disclosure.
Figure 6:
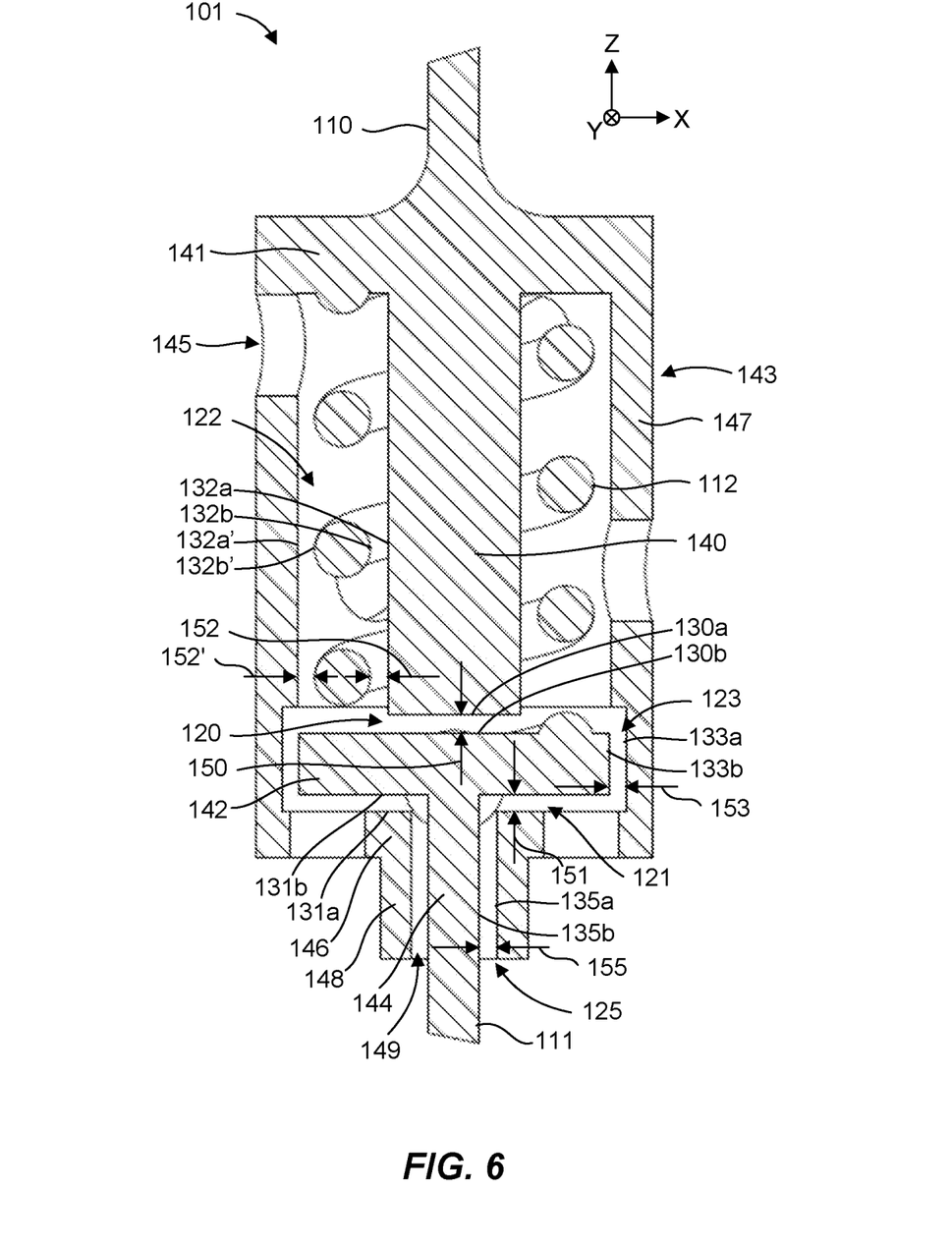
FIG. 6 is a detailed cross-sectional view of a flexure of FIG. 4 orthogonal to the view of FIG. 5.
Figure 7:
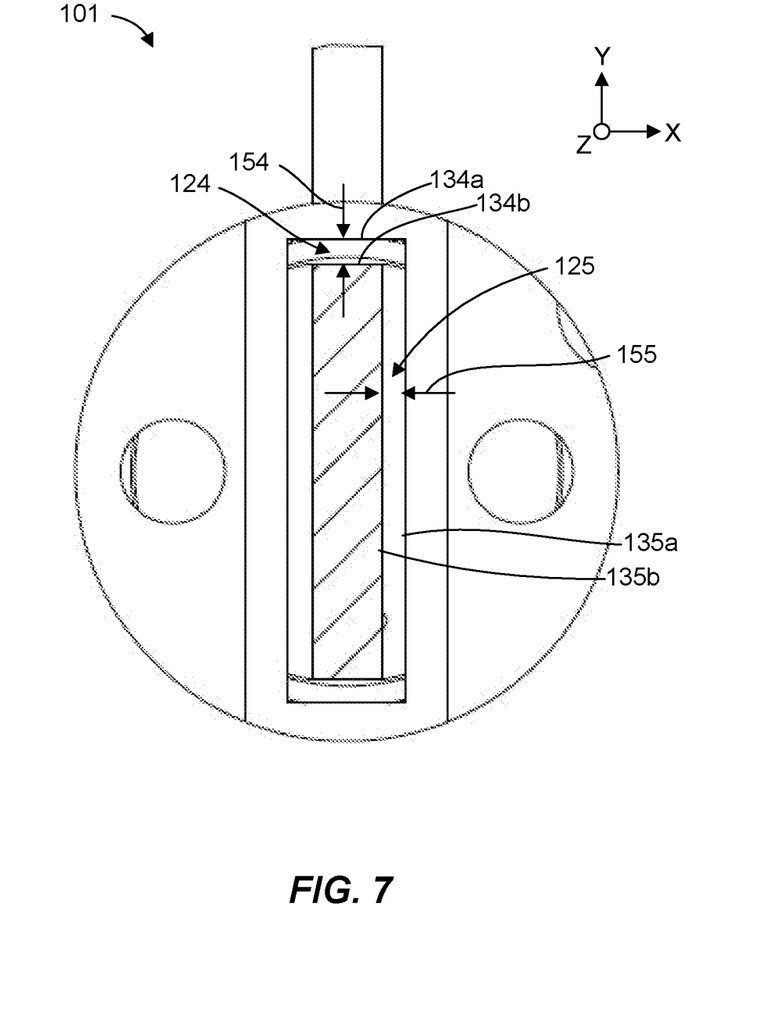
FIG. 7 is a detailed cross-sectional view of a flexure of FIG. 4 orthogonal to the views of FIGS. 5 and 6.
Figure 8:
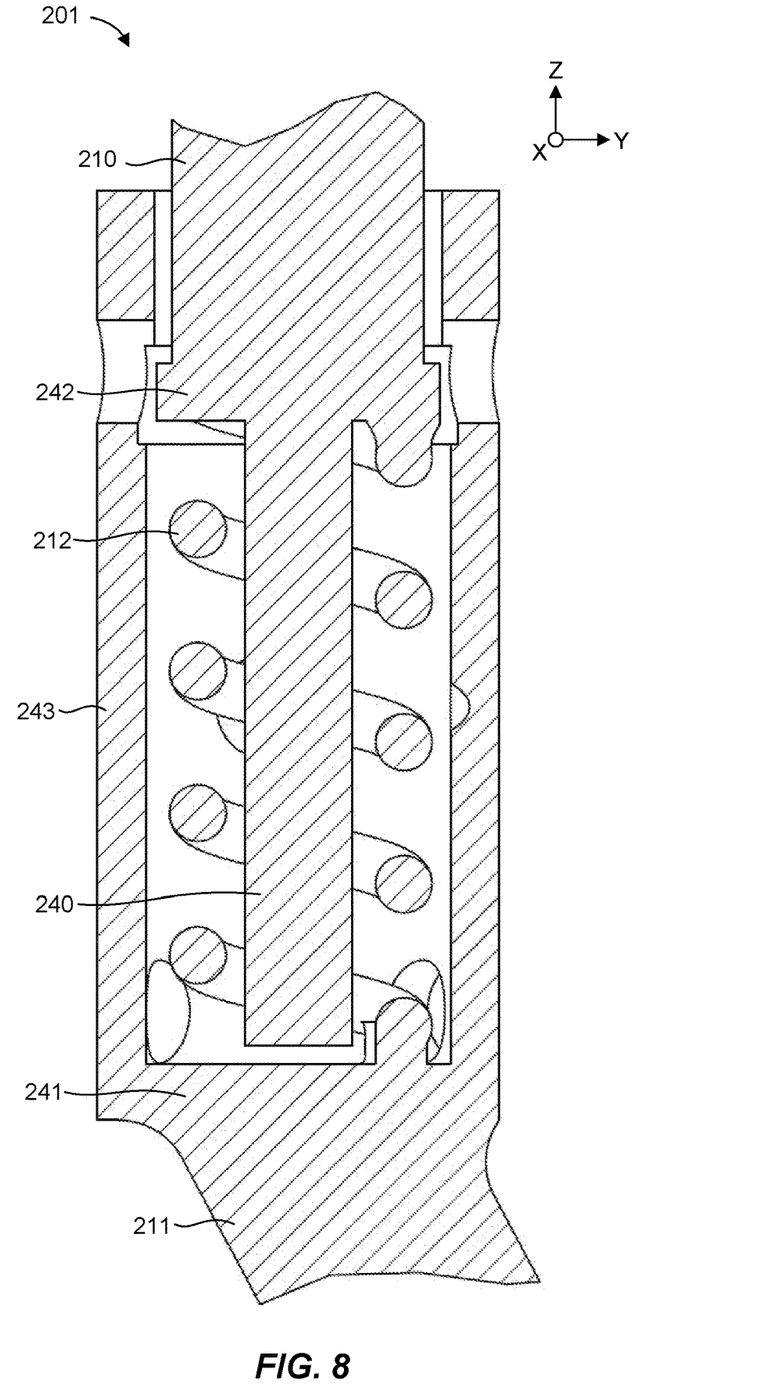
FIG. 8 is a detailed cross-sectional view of a flexure of FIG. 4 in accordance with another example of the present disclosure.
Figure 9:
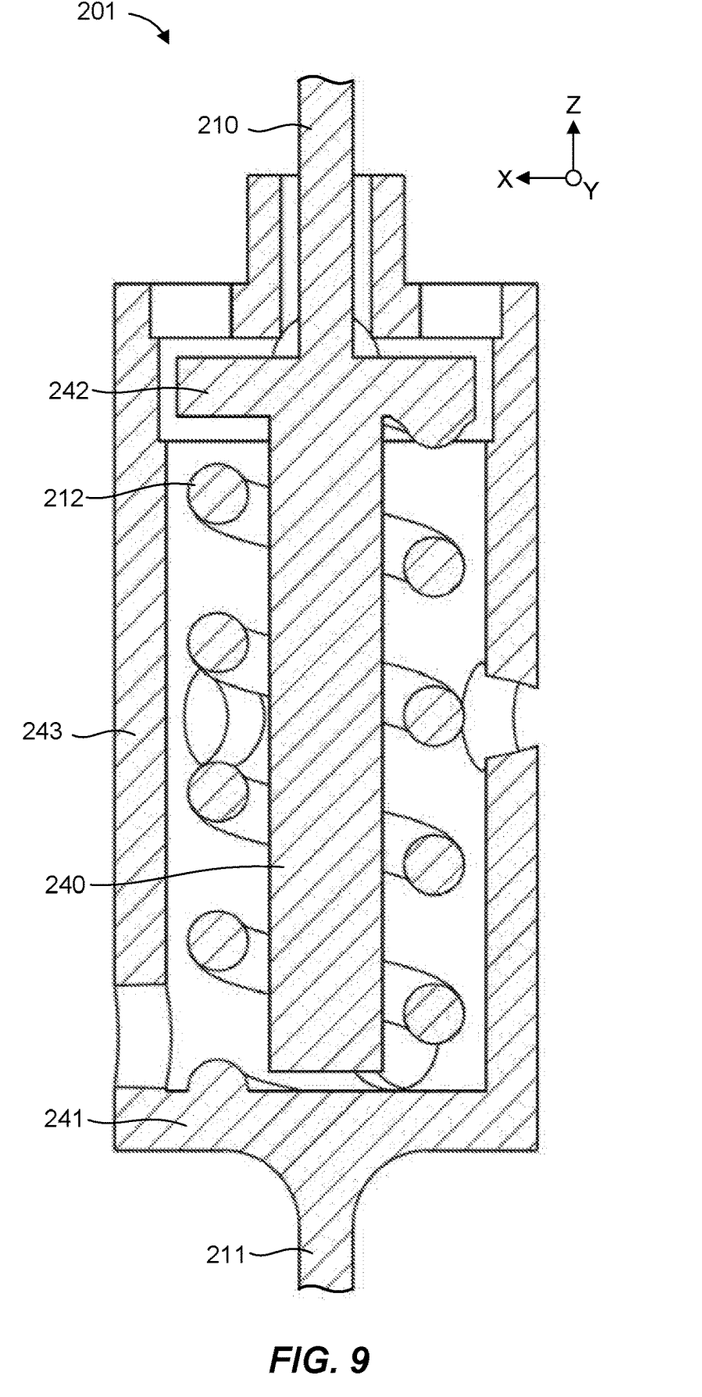
FIG. 9 is a detailed cross-sectional view of a flexure of FIG. 4 orthogonal to the view of FIG. 8.

FIGS. 3 and 4 show the flexures 101, 201 isolated from other structures of the assembly. FIG. 3 shows the flexures 101, 201 in a perspective view and FIG. 4 shows the flexures 101, 201 in cross-section. Detailed views of the flexure 101 are shown in FIGS. 5-7 and detailed views of the flexure 201 are shown in FIGS. 8 and 9. In the illustrated example, the flexures 101, 201 can be structurally combined into a flexure unit 106. Although the flexure unit 106 includes two flexures 101, 201, it should be recognized that a flexure unit can include one, two, or any number of flexures. Specific features of the flexure 301 of FIG. 1 are not shown in detail, but it should be recognized that the flexure 301 can have any suitable configuration, such as similar to that of the flexure 101 or the flexure 201, as these flexures are described below.

In general, a flexure can include a first portion, a second portion, and a flexible portion coupling the first portion and the second portion to one another. The flexible portion can facilitate relative movement between the first and second portions in one or more degrees of freedom. For example, as shown in FIGS. 5-7, the flexure 101 can include a first portion 110, a second portion 111, and a flexible portion 112 coupling the first and second portions 110, 111 to one another. The flexible portion 112 can facilitate relative movement between the first and second portions 110, 111 in one or more degrees of freedom, such as translational and/or rotational degrees of freedom. In some embodiments, the flexible portion 112 can be configured to facilitate relative movement between the first and second portions 110, 111 in six degrees of freedom (i.e., three translational and three rotational), although other configurations are contemplated that provide fewer translational and/or rotational degrees of freedom.

The flexible portion 112 can have any suitable configuration. For example, in the illustrated embodiment, the flexible portion 112 can comprise a coil or helical spring (e.g., a compression style spring). A coil spring can be flexible in translational degrees of freedom in a longitudinal spring axis (i.e., tension/compression axis), and flexible in two axes orthogonal to the longitudinal spring axis (i.e., shear axes). A coil spring can also be flexible in rotational degrees of freedom about the tension/compression and shear axes. As an example, local three-axis coordinate systems are shown in FIGS. 5-7 for flexure 101 and in FIGS. 8 and 9 for the flexure 201. The Z-axis of each coordinate system is parallel to the longitudinal spring axis (i.e., tension/compression axis) and the X and Y axes of each coordinate system are orthogonal to the Z-axis and parallel to the shear axes.

Spring stiffness can be the same or different in the various translational and rotational degrees of freedom. A spring can have any suitable geometry or structure to achieve a desired characteristic (e.g., progressive spring rate). For example, a coil spring can have any suitable cross-sectional shape (e.g., circular, rectangular, etc.), any suitable outer shape (e.g., cylindrical, conical, volute, etc.), constant or variable winding pitch, etc. In one aspect, a cross-sectional dimension can be selected to provide a desired thermal conduction area to improve or maximize heat transfer through the spring when a flexure is utilized as a conductive element in a thermal design. In another aspect, multiple coils can be arranged in parallel (e.g., side-by-side and/or a spring within a spring) to provide a desired thermal conduction area. It should be recognized that any suitable spring type or configuration can be utilized, as desired, such as to achieve a particular design objective. For example, in one embodiment, a Belleville spring can be utilized alone or in a series of such springs (e.g., a stack of Belleville springs). In another example, tension springs can be utilized as a substitute for the compression spring in the illustrated embodiment. In addition, the flexible portion 112 as well as the first and second portions 110, 111 can comprise any suitable material (e.g., metal, polymer, composite, etc.). A conductive material can be utilized when a flexure is utilized as a conductive element in a thermal design (e.g., as described in the embodiment of FIG. 2B), When thermal conduction is desired, a flexible portion can have any shape with sufficient flexibility while maximizing cross sectional thickness and minimizing conduction path length. For example, a lattice structure (e.g., a 3D honeycomb with some walls intentionally removed to provide flexibility) could fill a larger volume with more conductive area than other designs.

In one aspect, a flexure can include features configured to protect the flexible portion from damage, such as due to excessive deflection during installation or removal of a cover. For example, a flexure can include one or more stops operable to limit relative movement between the first and second portions in a degree of freedom. As shown in FIGS. 5-7, the flexure 101 can include one or more stops 120-125 (e.g., mechanical interferences) operable to limit relative movement between the first and second portions 110, 111. Stop 120 can be configured primarily to limit translational movement unidirectionally in the Z-axis. Stop 121 can be configured primarily to limit translational movement unidirectionally in the Z-axis in a direction opposite to that of stop 120. Stop 122 can be configured primarily to limit translational movement bidirectionally in the X and Y axes. Stop 123 can be configured as a secondary limit to translational movement bidirectionally in the X and Y axes. Stop 124 can be configured primarily to limit rotational movement about the X-axis. Stop 124 can also be configured as a secondary limit to translational movement in the Y-axis. Stop 125 can be configured primarily to limit rotational movement about the Y and Z axes. Stop 125 can also be configured as a secondary limit to translational movement in the X-axis. It should be appreciated that stops 120-123 may also serve as secondary limits to rotational movement about the X and Y axes.

Stops 120-125 can comprise or be defined by various interfaces (surfaces, multiple surfaces) associated with the first portion 110, the second portion 111, and/or the flexible portion 112. For example, stop 120 can comprise an interface 130a associated with the first portion 110, and an interface 130b associated with the second portion 111, which interfaces 130a, 130b are configured to interface with one another. In particular, the interface 130a can be defined at least partially by a protrusion 140 (e.g., an end or end surface of the protrusion 140) of the first portion 110 that is elongated in a direction parallel to the Z-axis. The protrusion 140 can extend from a base 141 in support of one end of the flexible portion 112 and through a center opening in the flexible portion 112 (e.g., inside a coil spring). The interface 130b can be defined at least partially by a platform 142 (e.g., a top surface of the platform 142) that is configured to support an opposite end of the flexible portion 112. The interfaces 130a, 130b can be separated by a gap 150 when the flexible portion 112 is in an undeflected condition.

Stop 121 can comprise an interface 131a associated with the first portion 110, and an interface 131b associated with the second portion 111, which interfaces 131a, 131b are configured to interface with one another. In particular, the interface 131a can be defined at least partially by a flexure cover 143 (e.g., an end wall 146 of the flexure cover 143) that extends from the base 141. The flexure cover 143 can be disposed about an exterior of the flexible portion 112 to shield and protect the flexible portion 112 from damage. The flexure cover 143 can have any suitable shape or configuration, which may be selected based on the general shape of the flexible portion 112. For example, the flexure cover 143 can have a cylindrical configuration when configured to shield or protect an underlying flexible portion configured as a typical coil spring. The interface 131b can be defined at least partially by the platform 142 (e.g., a bottom of the platform 142). The interfaces 131a, 131b can be separated by a gap 151 when the flexible portion 112 is in an undeflected condition.

Stop 122 can comprise interfaces 132a, 132a' associated with the first portion 110, and interfaces 132b, 132b' associated with the flexible portion 112. The interfaces 132a, 132b are configured to interface with one another, and the interfaces 132a', 132b' are configured to interface with one another. In particular, the interface 132a can be defined at least partially by the protrusion 140 (e.g., a side of the protrusion 140), and the interface 132a' can be defined at least partially by the flexure cover 143 (e.g., a side wall 147 of the flexure cover 143). The interfaces 132b, 132b' can be defined by surfaces on inner and outer sides, respectively, of the flexible portion 112. The interfaces 132a, 132b and the interfaces 132a', 132b' can be separated by respective gaps 152, 152' when the flexible portion 112 is in an undeflected condition.

Stop 123 can comprise an interface 133a associated with the first portion 110, and an interface 133b associated with the second portion 111, which interfaces 133a, 133b are configured to interface with one another. In particular, the interface 133a can be defined at least partially by the flexure cover 143 (e.g., the side wall 147 of the flexure cover 143). The interface 133b can be defined at least partially by the platform 142 (e.g., a lateral side of the platform 142). Thus, in one aspect, the platform 142 can be at least partially disposed within the flexure cover 143. The interfaces 133a, 133b can be separated by a gap 153 when the flexible portion 112 is in an undeflected condition.

Stop 124 can comprise an interface 134a associated with the first portion 110, and an interface 134b associated with the second portion 111, which interfaces 134a, 134b are configured to interface with one another. In particular, the interface 134a can be defined at least partially by the flexure cover 143 (e.g., a neck 148 extending from the end wall 146 of the flexure cover 143). The interface 134b can be defined at least partially by a platform base 144 (e.g., a lateral side of the platform base 144). In one aspect, the interface 134a can at least partially define an interface opening 149 in the end wall 146 of the flexure cover 143 and the neck 148, and the interface 134b can extend through the interface opening 149. The interfaces 134a, 134b can be separated by a gap 154 when the flexible portion 112 is in an undeflected condition.

Stop 125 can comprise an interface 135a associated with the first portion 110, and an interface 135b associated with the second portion 111, which interfaces 135a, 135b are configured to interface with one another. In particular, the interface 135a can be defined at least partially by the flexure cover 143 (e.g., the neck 148 extending from the end wall 146 of the flexure cover 143). The interface 135b can be defined at least partially by the platform base 144 (e.g., a lateral side of the platform base 144). In one aspect, the interface 135a can at least partially define the interface opening 149 in the end wall 146 of the flexure cover 143 and the neck 148, and the interface 135b can extend through the interface opening 149. The interfaces 135a, 135b can be separated by a gap 155 when the flexible portion 112 is in an undeflected condition.

The gaps 150, 151, 152, 152', 153, 154, 155 can be configured to provide adequate relative movement between the first and second portions 110, 111 to enable positioning and alignment of the coupling interfaces (e.g., coupling interfaces 104, 105 or coupling interfaces 104', 105') relative to one another in an interfacing relationship without allowing deflection of the flexible portion 112 that would cause yielding or permanent deformation (i.e., plastic deformation) of the flexible portion 112. The various gaps 150, 151, 152, 152', 153, 154, 155 can be the same or different, as desired, to provide a suitable range of motion between the first and second portions 110, 111 in a given degree of freedom, while limiting maximum deflection or range of motion of the flexible portion 112 to avoid over-stressing and damaging the flexible portion 112. Thus, the gaps can be sized to accommodate all tolerances in the assembly 100 between the coupling interfaces while enabling stops 120-125 to provide built-in protection for the flexible portion 112 in all available degrees of freedom against yielding failure. This can ensure that that flexure 101 can remain undamaged even when subjected to forces that would otherwise deform the flexible portion 112, such as during maintenance actions (e.g., removal of a cover without removing the fasteners that secure the cover to the flexure).

In one aspect, as shown in the illustrated embodiment of FIGS. 4-7, the first portion 110, the second portion 111, and the flexible portion 112 can form a single, unitary structure, although it should be recognized that any of these components can be a separate and distinct structure coupled to one another. The flexure 101 can be constructed using any suitable fabrication process or technique. In some embodiments, the flexure 101 can be constructed utilizing additive manufacture (e.g., stereo lithography) techniques to provide cost savings (e.g., reduced manufacturing cost, reduced part count, and reduced assembly time). Openings 145 in the flexure cover 143 can be configured to provide drain and/or venting benefits during manufacture and use. The flexure 101 and any of its components can be made of any suitable material, such as a polymer, a metal, a composite, etc. In some cases, additive manufacturing techniques result in materials that are relatively brittle, which may limit the amount of deflection that the flexible portion 112 can tolerate without failure. As mentioned above, stops 120-125 can provide built-in protection for the flexible portion 112, thus enabling use of a relatively brittle material constructed by additive manufacturing techniques to provide cost-savings and robust, durable part. In addition to providing certain features of the stops as described above, the flexure cover 143 can also provide protection for the flexible portion 112 from external objects, such as preventing impact or contact with sharp objects that may damage or weaken the flexible portion 112.

The flexure 201 has many similarities to the flexure 101, as shown in FIGS. 4, 8, and 9. For example, the flexure 201 can include a first portion 210, a second portion 211, and a flexible portion 212 coupling the first and second portions 210, 211 to one another. The flexible portion 212 can facilitate relative movement between the first and second portions 210, 211 in one or more degrees of freedom, such as translational and/or rotational degrees of freedom. In one embodiment, the flexible portion 212 can be configured to facilitate relative movement between the first and second portions 210, 211 in six degrees of freedom (i.e., three translational and three rotational). The flexure 201 also includes stops similar to those described above to limit maximum deflection of the flexible member 212.

In this case, the flexure 201 includes a protrusion 240 and a platform 242 that are integrated into a single component instead of being configured to interface with one another to provide a stop feature as in the flexure 101. The protrusion 240 and the platform 242 can be associated with the first portion 210. The protrusion 240 can extend from the platform 242 (optionally through a center opening in the flexible portion 212) and can be configured to interface with a base 241 of the second portion 211 in support of one end of the flexible portion 212 to provide a stop. A flexure cover 243 can extend from the base 241 to protect the flexible portion 212. The platform 242, which can support an opposite end of the flexible portion 212, can be configured to interface with an end wall of the flexure cover 243. Where the features are similar, the flexible portion 212, the protrusion 240, the platform 242, and the flexure cover 243 can be configured to interface as described above with regard to the flexure 101 to provide protective stops that limit maximum deflection of the flexible portion 212.

In one aspect, the first portion 210, the second portion 211, and the flexible portion 212 can form a single, unitary structure, although any of these components can be a separate and distinct structure. In another aspect, the flexures 101, 102 of the flexure unit 106 (FIGS. 3 and 4) can form a single, unitary structure, although it should be recognized that any of these components can be a separate and distinct structure.

In accordance with one embodiment of the present invention, a method is disclosed for facilitating alignment of parts in an assembly. The method can comprise providing a first portion. The method can also comprise providing a second portion. The method can further comprise providing a flexible portion coupling the first portion and the second portion to one another, the flexible portion facilitating relative movement between the first and second portions in a plurality of degrees of freedom. Additionally, the method can comprise limiting relative movement between the first and second portions in at least two of the plurality of degrees of freedom less than a range of motion of the flexible portion in the at least two of the plurality of degrees of freedom. In one aspect of the method, limiting relative movement between the first and second portions can comprise providing one or more stops. It is noted that no specific order is required in this method, though generally in one embodiment, these method steps can be carried out sequentially.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Although the disclosure may not expressly disclose that some embodiments or features described herein may be combined with other embodiments or features described herein, this disclosure should be read to describe any such combinations that would be practicable by one of ordinary skill in the art. The user of "or" in this disclosure should be understood to mean non-exclusive or, i.e., "and/or," unless otherwise indicated herein.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. A flexure, comprising:
    a first portion;
    a second portion operable to move relative to the first portion in a plurality of degrees of freedom;
    a flexible portion coupling the first portion and the second portion to one another, the flexible portion being coupled at a first end to the first portion in a fixed relationship and coupled at a second end to the second portion in a fixed relationship so as to fix a positon of the first and second ends of the flexible portion relative to the first and second portions along a longitudinal axis, the first portion, the second portion, and the flexible portion form a single, unitary structure, the flexible portion facilitating relative movement between the first and second portions in the plurality of degrees of freedom; and one or more stops operable to limit relative movement between the first and second portions in at least two of the plurality of degrees of freedom.

2. The flexure of claim 1, wherein the at least two of the plurality of degrees of freedom comprises a translational degree of freedom, a rotational degree of freedom, or a combination thereof.

3. The flexure of claim 1, wherein the flexible portion comprises a coil spring.

4. The flexure of claim 1, wherein the one or more stops comprise a first interface associated with the first portion, and a second interface associated with the second portion.

5. The flexure of claim 4, wherein one of the plurality of degrees of freedom is a translational degree of freedom defining a degree of freedom axis, and the first interface is defined at least partially by a protrusion having a longitudinal axis oriented parallel to the degree of freedom axis.

6. The flexure of claim 5, wherein the first interface is defined by an end of the protrusion, a side of the protrusion, or a combination thereof.

7. The flexure of claim 4, wherein the first and second interfaces are configured to interface with one another.

8. The flexure of claim 4, wherein the first and second interfaces are configured to interface with the flexible member.

9. The flexure of claim 4, wherein at least one of the first portion or the second portion comprises a cover disposed about an exterior of the flexible portion.

10. The flexure of claim 9, wherein the first interface is formed at least partially by the cover.

11. The flexure of claim 10, wherein the first interface is formed by a side wall of the cover, an end wall of the cover, or a combination thereof.

12. The flexure of claim 9, wherein the first interface is defined at least partially by a platform disposed within the cover.

13. The flexure of claim 9, wherein the first interface defines an interface opening in an end wall of the cover, and the second interface of the first or second portion extends through the interface opening.

14. The flexure of claim 9, wherein the cover comprises a cylindrical configuration.

15. A flexure assembly, comprising:
a first mounting structure;
a first coupling interface associated with the first mounting structure in a fixed relationship;
a second coupling interface operable to interface with the first coupling interface;
a second mounting structure operable to be coupled to the first mounting structure in a fixed relationship; and
a flexure operable to facilitate positioning of the first and second coupling interfaces relative to one another in an interfacing relationship, the flexure having a first portion associated with the second coupling interface, a second portion coupled to the second mounting structure,
a flexible portion coupling the first portion and the second portion to one another, the flexible portion being coupled at a first end to the first portion in a fixed relationship and coupled at a second end to the second portion in a fixed relationship so as to fix a positon of the first and second ends of the flexible portion relative to the first and second portions along a longitudinal axis, the first portion, the second portion, and the flexible portion form a single, unitary structure, the flexible portion facilitating relative movement between the first and second portions in a plurality of degrees of freedom; and
one or more stops operable to limit relative movement between the first and second portions in at least two of the plurality of degrees of freedom.

16. The assembly of claim 15, wherein the first mounting structure comprises a heat sink for an electronic device, and the second mounting structure comprises a support frame operable to support the electronic device.

17. The assembly of claim 16, wherein the first coupling interface comprises a heat sink surface, and the second coupling interface is defined at least partially by the electronic device which is coupled to the first portion of the flexure.

18. The assembly of claim 16, wherein the first mounting structure further comprises a housing to cover the electronic device.

19. The assembly of claim 15, wherein the second mounting structure comprises an electronic device, and the first mounting structure comprises a heat sink for the electronic device.

20. The assembly of claim 19, wherein the first mounting structure further comprises a housing to cover the electronic device.

21. The assembly of claim 19, wherein the flexure forms a thermal conduction path between the electronic device and the heat sink.

22. The assembly of claim 15, wherein the first coupling interface comprises a heat sink surface, and the second coupling interface is defined at least partially by the first portion of the flexure.

23. The assembly of claim 15, wherein the first coupling interface is associated with the first mounting structure in a fixed relationship.

24. A flexure, comprising:
a first portion;
a second portion operable to move relative to the first portion in a plurality of degrees of freedom;
a flexible portion coupling the first portion and the second portion to one another, the flexible portion being coupled at a first end to the first portion in a fixed relationship and coupled at a second end to the second portion in a fixed relationship so as to fix a positon of the first and second ends of the flexible portion relative to the first and second portions along a longitudinal axis, the first portion, the second portion, and the flexible portion form a single, unitary structure, the flexible portion facilitating relative movement between the first and second portions in the plurality of degrees of freedom; and
at least one stop operable to limit relative movement between the first and second portions bidirectionally in at least two of the plurality of degrees of freedom.

25. A flexure assembly, comprising:
a first mounting structure;
a first coupling interface associated with the first mounting structure;
a second coupling interface operable to interface with the first coupling interface;
a second mounting structure operable to be coupled to the first mounting structure in a fixed relationship; and
a flexure operable to facilitate positioning of the first and second coupling interfaces relative to one another in an interfacing relationship, the flexure having a first portion associated with the second coupling interface, a second portion coupled to the second mounting structure, a flexible portion coupling the first portion and the second portion to one another, the flexible portion being coupled at a first end to the first portion in a fixed relationship and coupled at a second end to the second portion in a fixed relationship so as to fix a position of the first and second ends of the flexible portion relative to the first and second portions along a longitudinal axis, the first portion, the second portion, and the flexible portion form a single, unitary structure, the flexible portion facilitating relative movement between the first and second portions in a plurality of degrees of freedom; and at least one stop operable to limit relative movement between the first and second portions bidirectionally in at least two of the plurality of degrees of freedom.

26. A method for facilitating alignment of parts in an assembly, comprising:

providing a first portion;

providing a second portion operable to move relative to the first portion in a plurality of degrees of freedom;

providing a flexible portion coupling the first portion and the second portion to one another, the flexible portion being coupled at a first end to the first portion in a fixed relationship and coupled at a second end to the second portion in a fixed relationship so as to fix a positon of the first and second ends of the flexible portion relative to the first and second portions along a longitudinal axis, the first portion, the second portion, and the flexible portion form a single, unitary structure, the flexible portion facilitating relative movement between the first and second portions in the plurality of degrees of freedom; and limiting relative movement between the first and second portions in at least two of the plurality of degrees of freedom less than a range of motion of the flexible portion in the at least two of the plurality of degrees of freedom.

27. The method of claim 26, wherein limiting relative movement between the first and second portions comprises providing one or more stops.

28. A flexure, comprising:

a first portion;

a second portion operable to move relative to the first portion in a plurality of degrees of freedom;

a flexible portion coupling the first portion and the second portion to one another, the flexible portion being formed at a first end with the first portion in a fixed relationship and formed at a second end with the second portion in a fixed relationship so as to fix a positon of the first and second ends of the flexible portion relative to the first and second portions along a longitudinal axis, the first portion, the second portion, and the flexible portion form a single, unitary structure, the flexible portion facilitating relative movement between the first and second portions in the plurality of degrees of freedom; and one or more stops operable to limit relative movement between the first and second portions in at least two of the plurality of degrees of freedom.

* * * * *